United States Patent [19]

White

[11] Patent Number: 4,576,679
[45] Date of Patent: Mar. 18, 1986

[54] METHOD OF FABRICATING A COLD SHIELD

[75] Inventor: William J. White, Chelmsford, Mass.

[73] Assignee: Honeywell Inc., Minneapolis, Minn.

[21] Appl. No.: 668,681

[22] Filed: Nov. 5, 1984

Related U.S. Application Data

[60] Continuation of Ser. No. 520,951, Aug. 8, 1983, abandoned, which is a division of Ser. No. 248,127, Mar. 27, 1981, Pat. No. 4,431,918.

[51] Int. Cl.$^4$ .................... B44C 1/22; C03C 15/00; C03C 25/06
[52] U.S. Cl. .................................. 156/644; 65/31; 156/654; 156/659.1; 156/663; 430/313; 430/321
[58] Field of Search ............ 156/644, 654, 657, 659.1, 156/663; 65/31; 430/523–527, 313, 317, 321; 250/338, 349

[56] References Cited

U.S. PATENT DOCUMENTS 2,992,586  7/1961  Upton .............................. 156/644 X
3,492,523  1/1970  Smith et al. ..................... 156/644 X Primary Examiner—William A. Powell
Attorney, Agent, or Firm—John P. Sumner

[57] ABSTRACT

A shield for limiting the radiation received by individual detectors within a detector array of an electromagnetic radiation detection system to the radiation provided to the detectors by the optics of the system. The shield comprises a member of etchable glass having apertures formed therein, the position of the aperture edges being in predetermined relation to the edges of the detectors for shielding the detectors from electromagnetic radiation generated outside the field of view of the optics.

4 Claims, 8 Drawing Figures

METHOD OF FABRICATING A COLD SHIELD

This application is a continuation of application Ser. No. 520,951, filed Aug. 8, 1983, now abandoned, which is a division of application Ser. No. 248,127, filed Mar. 27, 1981, now U.S. Pat. No. 4,431,918.

BACKGROUND OF THE INVENTION

The present invention relates to shielding undesirable background electromagnetic radiation from background limited radiation detectors. Such shielding is particularly applicable to infrared detectors and systems. However, shields in accordance with the present invention are equally applicable to other background limited detector systems in which it is desirable to shield background radiation in the spectral or electromagnetic energy band of the system detectors.

With background limited infrared detectors, individual detector sensitivity or figure of merit is generally recognized to be inversely proportional to the square root of background radiation. Therefore, it is desirable to limit detector background so that each detector in an array sees only the applicable optics of the infrared system.

Lowering background by shielding at the optics is cumbersome and adds weight or complexity to the system. Accordingly, shielding at the detector has long been recognized as an effective and workable approach to limiting background radiation. One such approach is described in U.S. Pat. No. 3,963,926, S. R. Borrello, "Detector Cold Shield" (hereinafter Borrello); however, as is further explained below, such cold shields have limited effectiveness in high density arrays and in mosaic arrays. Arrays of this nature, which are highly desirable in modern infrared systems, have not previously been adequately shielded from background radiation.

SUMMARY OF THE INVENTION

The present invention is a shield for limiting the radiation received by individual detectors within a detector array of an electromagnetic radiation detection system to the radiation provided to the detectors by the optics of the system. The shield comprises a member of etchable glass having apertures formed therein, the position of the aperture edges being in predetermined relation to the edges of the detectors for shielding the detectors from electromagnetic radiation generated outside the field of view of the optics.

DESCRIPTION OF THE PREFERRED EMBODIMENT

Figure 1:
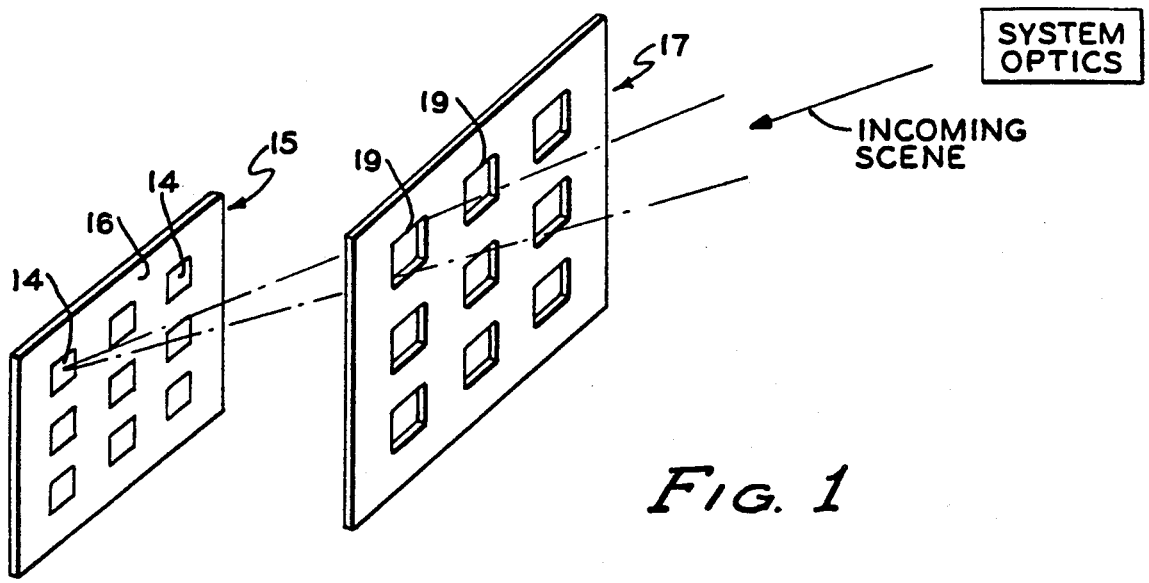
FIG. 1 schematically illustrates an electromagnetic radiation of thermal energy detection system.

Referring to FIG. 1, for a given focal plane or image surface 16 on an array 15 of individual semiconductor detectors 14, the system figure of merit increases as the number of detectors located within the focal plane are increased. If one assumes a cold shield 17 having an aperture 19 corresponding to each detector within an array, it is generally recognized that the closer the cold shield plane is to the detectors, the poorer the cold shielding efficiency.

However, in a system comprising a mosaic or two dimensional array such as array 15, fewer detectors 14 per unit area can be put into the detector or image plane as the distance between the cold shield plane and the image or detector plane is increased. Accordingly, a long felt need and design methodology for mosaic arrays can be stated as follows: one should attempt to make a cold shield as far from the detector as possible within limits of the cold shield aperture size packing density. That is, one seeks to obtain a structure having sufficient strength with minimum wasted space for support of the cold shield apertures.

Figure 2:
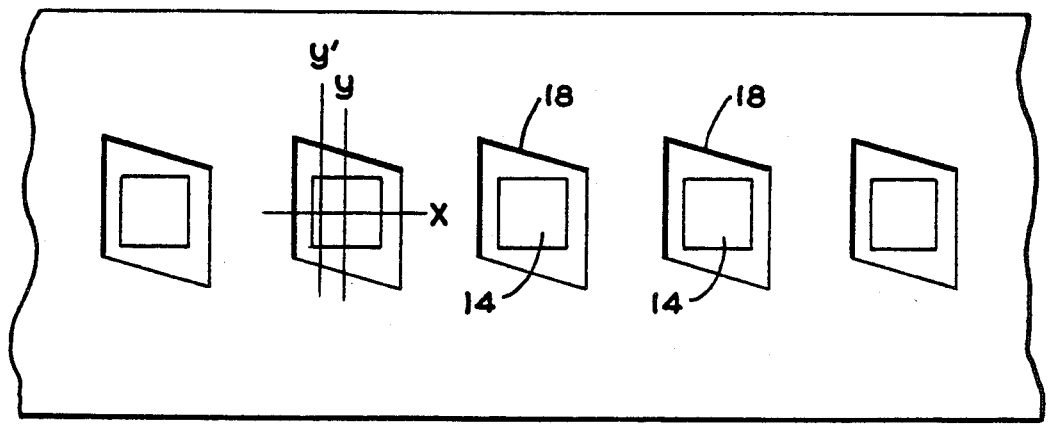
FIG. 2 illustrates a linear detector array shielded by a cold shield etched in silicon.

Borrello discloses a cold shield etched in silicon and having a shape when viewed from the system optics as illustrated in FIG. 2, wherein cold shield apertures 18 are illustrated above a linear array of detectors 14 (FIG. 2 is based upon FIG. 10 of Borrello). Thus, as is illustrated in FIG. 2, the cold shield disclosed in Borrello can be designed and spaced to provide excellent shielding in the x direction but only varying shield efficiency in the y direction. Such varying efficiency in the y direction arises due to the contrasting shape of apertures 18 and detectors 14. As is further explained in Borrello, the angled edges of apertures 18 in silicon cold shields arise due to the angled crystalline etch planes in silicon. Thus, the apertures of cold shields etched in silicon have a shape unlike the shape of conventional detectors with the result that, for example, shielding along line y may be symmetrical and thus could be optimum, while shielding along line y' is skewed off center and thus fails to subtend the optics properly.

Figure 3:
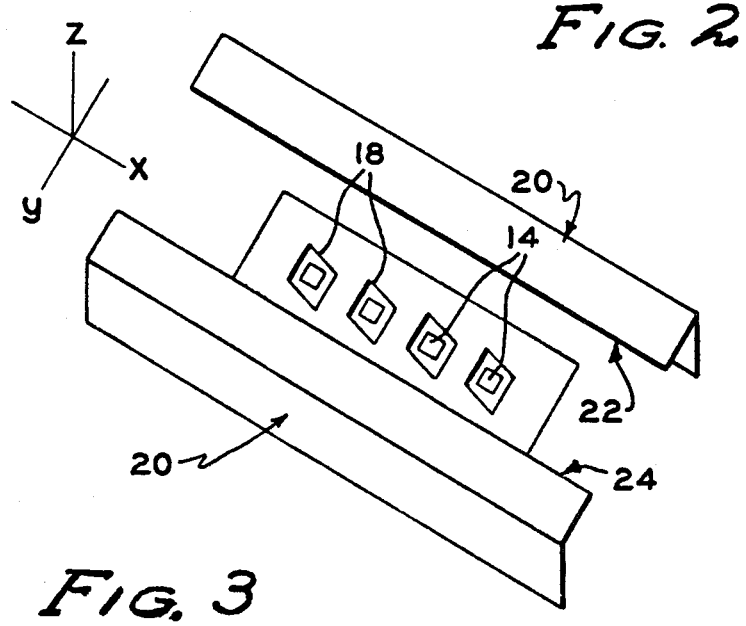
FIG. 3 illustrates the arrangement of FIG. 2 with further shielding being provided by a supplementary cold shield.

Accordingly, relatively good cold shielding can be obtained for a linear array using a cold shield etched in silicon as described in Borrello. This is illustrated in FIG. 3, from which it can be seen that apertures 18 can be designed to provide excellent shielding in planes parallel to the xy plane, but only marginal shielding in planes parallel to the yz plane. For a linear array, the marginal shielding in planes parallel to the yz plane can be improved by use of a supplementary cold shield 20 which provides edges 22 and 24. The slot formed by edges 22 and 24 provides a shield of higher efficiency than the angled edges of apertures 18.

However, for mosaic or two dimensional arrays such as shown in FIG. 1, packing density of the individual detectors would be severely limited by the necessity to put supplementary shields 20 between the individual rows of detectors within the array. As a result, individuals skilled in the art have long desired a method of producing cold shields in which each aperture may be shaped to match the shape of the detectors, e.g., cold shield apertures having a square shape for square detectors, round apertures for round detectors, etc. As previously indicated, such configurations are not possible with the Borrello cold shield because of the crystalline etch planes in silicon.

Figure 4:
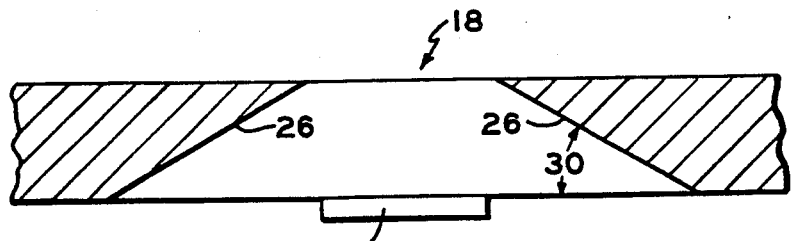
FIGS. 4 and 5 illustrate cross sections of cold shields etched in silicon.
Figure 5:
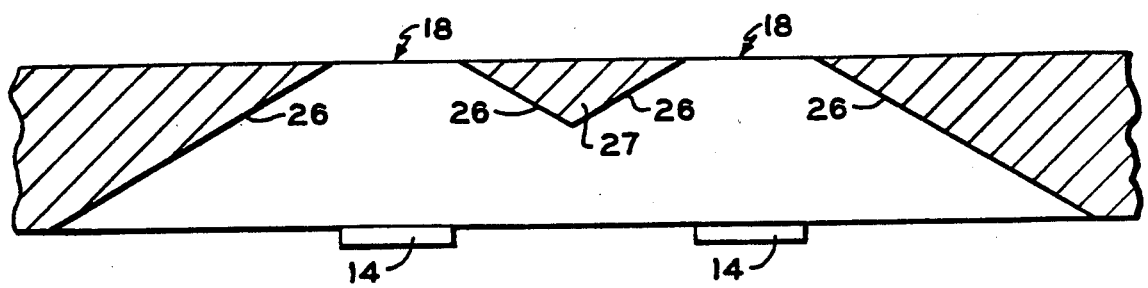
Figure 6:
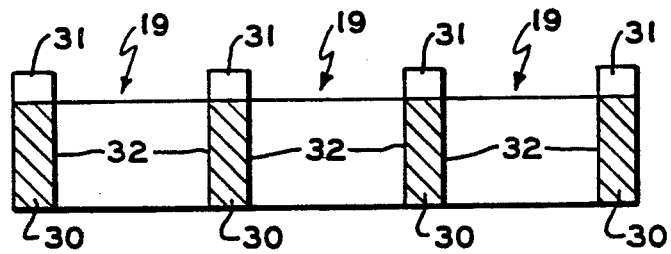
FIG. 6 illustrates a cross section of a cold shield being processed in accordance with the present invention.
Figure 8:
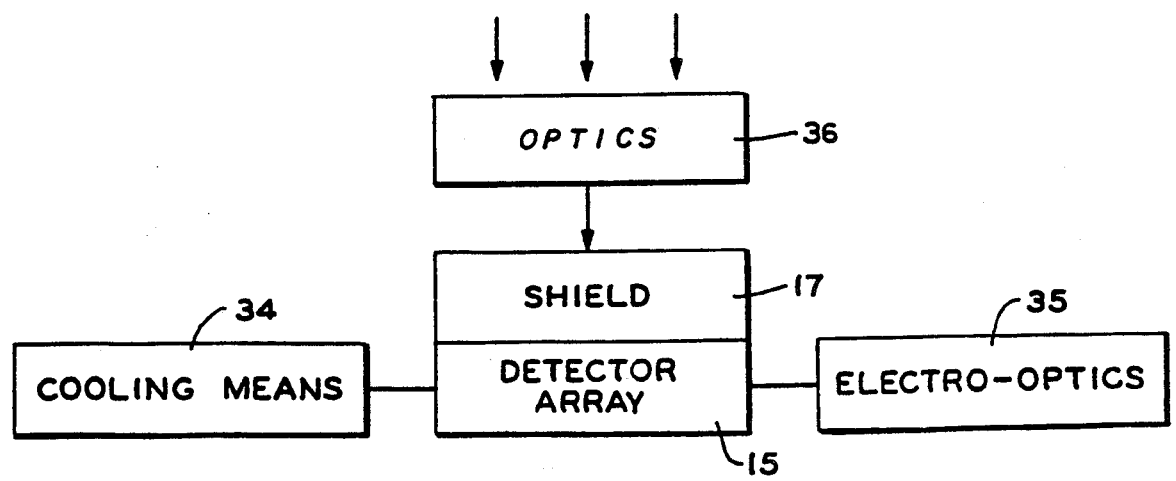
FIG. 8 is a block diagram of an infrared or other electromagnetic energy detection system.

A further limiting factor of cold shields etched in silicon is illustrated in FIG. 4, which is based on FIG. 8 of Borrello. Thus, for cold shields etched in silicon, the walls of each aperture include sloping surfaces 26, which form an angle 30 of 30° with the image plane. As a result, aperture packing density in this direction is limited by sloping surfaces 26. Alternately, if in spite of sloping surfaces 26 one attempts to achieve high packing density in a silicon cold shield, one is left with minimal supporting structure 27, as is illustrated in FIG. 5.

Accordingly, an additional long felt need by persons skilled in the art has been to produce a cold shield wherein the sides of each cold shield aperture are orthogonal to the image or detector plane. In this manner one can obtain a structure following the previously mentioned design methodology where the structure has sufficient strength with a minimum of wasted space for support of each aperture.

Figure 7:
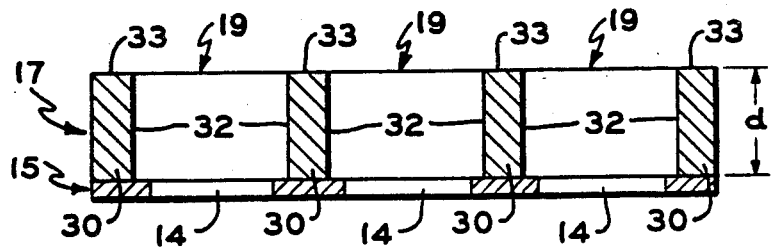
FIG. 7 illustrates a cross section of an etchable glass cold shield mounted on a detector array.

To this end, it has now been found that cold shields can be fabricated having an aperture shape to match the shape of the individual detectors and having walls orthogonal to the plane of the detector array. Such a cold shield may be fabricated of etchable glass, which may be of thickness d to define the cold shield height, a typical thickness being 75 to 125 micrometers. A photoresist pattern as typically used for silicon integrated circuits is formed on the surface of the etchable glass, the glass being protected by photoresist 31 where supporting structures 30 will be located and exposed where cold shield apertures 19 will be located. (In this application, apertures etched in silicon are referred to by reference numeral 18, and apertures etched in etchable glass are referred to by reference numeral 19.) The glass is then etched and the photoresist removed, thus forming the cold shield. FIG. 7 illustrates such a cold shield 17 mounted on an array 15 of individual detectors 14.

An etchable glass cold shield is inherently opaque to long wave infrared (LWIR), so no coating is necessary to prevent LWIR optical transmission and cross talk. However, surface 33 and walls 32 can be coated with an absorbent material for absorbing electromagnetic radiation, thus preventing short wave infrared (SWIR) and visible transmission and cross talk. By absorbing electromagnetic radiation, the absorbent material will also prevent reflections. For example, these surfaces may be plated "platinum black" as is commonly used for pyroelectric detectors.

A typical infrared system may be described as an electromagnetic radiation detection system. As is illustrated in FIG. 8, such a system normally includes optics 36 for viewing a scene initiating electromagnetic radiation, the optics providing a field of view of the scene (optics 36 could include an optical scanner; alternately, the system could employ starring sensors and would not include an optical scanner). The system also includes an array 15 of electromagnetic radiation detectors mounted in the path of the field of view of the optics for producing electrical signals representative of the electromagnetic radiation impinging on the detectors. In accordance with the present invention, such a system also includes a shield 17 comprising a member of etchable glass having apertures formed in the glass. The position of the aperture edges are in predetermined relation to the edges of the detectors for shielding interfering electromagnetic radiation generated outside the field of view of the optics to improve the sensitivity of the detector array. The system also includes cooling means 34 for cooling the array of detectors and the shield. Electro-optics 35 coupled to the electrical output of the array of detectors form a display of the scene viewed by the optics.

The present invention is to be limited only in accordance with the scope of the appended claims since persons skilled in the art may devise other embodiments or processes still within the limits of the claims.

The embodiments of the invention in which an exclusive property or right is claimed are defined as follows:

1. A method of fabricating a shield for limiting the radiation received by individual detectors within a detector array in an electromagnetic radiation detection system to the radiation provided to the detectors by optics within the system, the shield comprising a member of etchable glass having apertures formed therein, comprising:

forming, on a first surface of an etchable glass member, an etch resist pattern, the etch resist pattern protecting areas of the glass where supporting walls of the shield will be located, the glass being exposed where the apertures will be located, the etch resist pattern defining the size and shape of each aperture, the size and shape of each aperture being in predetermined relation to the size and shape of the detectors in order to shield the detectors from electromagnetic radiation generated outside the field of view of the optics;

etching the glass to form the apertures;

removing the etch resist; and mounting the formed glass shield upon an array of individual detectors.

2. The method of claim 1 wherein the detectors as viewed from the optics have a particular geometrical configuration and wherein the apertures as viewed from the optics have a matching geometrical configuration.

3. The method of claim 2 wherein the supporting walls of the shield are formed to be substantially perpendicular to the first surface of the etchable glass.

4. The method of claim 1 wherein the supporting walls of the shield are formed to be substantially perpendicular to the first surface of the etchable glass.

* * * * *